United States Patent
Balachandran et al.

(10) Patent No.: US 6,466,805 B2
(45) Date of Patent: Oct. 15, 2002

(54) SHIELDED HIGH-$T_C$ BSCCO TAPES OR WIRES FOR HIGH FIELD APPLICATIONS

(75) Inventors: Uthamalingam Balachandran, Hinsdale; Milan Lelovic, Wheaton, both of IL (US); Nicholas G. Eror, Pittsburgh, PA (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 09/842,502

(22) Filed: Apr. 26, 2001

(65) Prior Publication Data

US 2002/0004463 A1 Jan. 10, 2002

Related U.S. Application Data

(62) Division of application No. 09/349,322, filed on Jul. 8, 1999, now Pat. No. 6,253,096.

(51) Int. Cl.[7] .......................... H01B 12/02; H01B 12/10
(52) U.S. Cl. ...................... 505/231; 505/234; 505/236; 505/238
(58) Field of Search ................................. 505/231, 234, 505/237, 238, 236; 174/125.1; 428/930

(56) References Cited

U.S. PATENT DOCUMENTS

| | | | | |
|---|---|---|---|---|
| 4,952,554 A | * | 8/1990 | Jin et al. |
| 5,151,406 A | * | 9/1992 | Sawada et al. |
| 5,504,058 A | * | 4/1996 | Tanaka et al. |
| 5,874,384 A | * | 2/1999 | Balachandran et al. |
| 5,908,812 A | * | 6/1999 | Cotton et al. |
| 5,952,614 A | * | 9/1999 | Ries |
| 6,038,462 A | * | 3/2000 | Snitchler et al. |
| 6,069,116 A | * | 5/2000 | Li et al. |
| 6,205,345 B1 | * | 3/2001 | Sato et al. |
| 6,305,070 B1 | * | 10/2001 | Masur et al. |
| 6,313,408 B1 | * | 11/2001 | Fujikami et al. |
| 6,393,690 B1 | * | 5/2002 | Snitchler et al. |

* cited by examiner

Primary Examiner—M. Alexandra Elve
Assistant Examiner—Colleen P. Cooke
(74) Attorney, Agent, or Firm—Emrich & Dithmar

(57) ABSTRACT

A composite superconductor having an interior component of multiple filaments of superconducting Bi-2223 sheathed in a Ag or Ag alloy material, and a RE, TI or Hg based superconductor surrounding the interior component.

8 Claims, 10 Drawing Sheets

AS-COATED hkl: 103
Proj: Wulf
Scale: Manual
--- 1.00
--- 1.25
--- 1.50
--- 2.00
--- 2.50
--- 3.00
Maoc 5.32
Psi: 25.0
Phi: 95.0

Phi = 0

HEAT-TREATED hkl: 103
Proj: Wulf
Scale: Manual
--- 1.00
--- 1.25
--- 1.50
--- 2.00
--- 2.50
--- 3.00
Maoc 3.75
Psi: 35.0
Phi: 90.0

Phi = 0

SHIELDED HIGH-$T_C$ BSCCO TAPES OR WIRES FOR HIGH FIELD APPLICATIONS

This is a divisional of application Ser. No. 09/349,322 filed Jul. 8, 1999 now U.S. Pat. No. 6,253,096.

The United States Government has rights in this invention pursuant to Contract No. W-31-109-ENG-38 between the U.S. Department of Energy and The University of Chicago representing Argonne National Laboratory.

TECHNICAL FIELD

This invention relates to composite superconductors and more particularly to Bi-2223 superconductors surrounded by other superconducting materials.

BACKGROUND OF THE INVENTION

The powder-in-tube (PIT) process, which yields a highly textured (Bi, Pb)$_2$Sr$_2$Ca$_2$Cu$_3$O$_y$ (Bi-2223) superconductor with its c-axis aligned parallel to the tape surface, is an industrially scalable technique for fabricating long-length superconductors. In zero applied magnetic field, the critical current density ($J_c$) of superconducting tape is controlled by its microstructure. Grain boundaries act as barriers to the transfer of transport current between grains. The crystallographic anisotropy of Bi-2223, which exhibits a micaceous or platelike morphology, allows large contact areas alignment of grains with their c-axis perpendicular to the rolling direction of the tape, easy transfer of current across its grain boundaries, and high $J_c$ values. The fabrication of YBa$_2$Cu$_3$O$_{7-\delta}$ (Y-123) wires by the PIT technique has not been successful because of YBCO's granularity. Y-123 exhibits greater isotropy than Bi-2223 and its intergranular transport current is poor because of weak links. In an applied magnetic field, Y-123 shows much better $J_c$ response than Bi-2223 and the irreversibility line (IRL) of high-$T_c$ materials can provide insight into materials limitations for various applications.

Recent progress in growing single crystals of Bi-2223 provided an opportunity to study its IRL line. A sharp irreversibility field (H*) drop was observed between 20 and 40 K. At 75 K, H* was only ≈0.3 T. This observation clearly shows very weak intrinsic pinning in Bi-2223 single crystals. Intrinsic pinning in Y-123 single crystal is sufficiently strong to keep H* at 77 K to ≈8 T. Using ion-beam-assisted deposition (IBAD), c-axis-oriented Y-123 thin films have been deposited on polycrystalline metallic tapes buffered with yttria stabilized zirconia (YSZ). A significant improvement of the in-plane texture led to a high $J_c$ above $10^6$ (A/cm$^2$).

Another method of depositing thin films is called rolling-assisted biaxial textured substrates (RABiT). A biaxially textured nickel substrate was aligned to within a few degrees.

Epitaxial growth of oxide buffer layers on the substrate made possible the growth of Y-123 films that were 1.5 $\mu$m thick and exhibited superconducting properties comparable to those observed for epitaxial films on single-crystal substrates. The transport current density as a function of temperature and applied magnetic field of Bi-2223/Ag wires and tapes, show that practical applications are limited to either low temperature and high magnetic field ≈20 K and ≈10 T or high temperature and low magnetic field ≈77K and less than 0.5 T.

BRIEF SUMMARY OF THE INVENTION

It is a general object of the invention to combine the good alignment of Bi-2223 grains in Ag-sheathed superconducting tapes to obtain high $J_c$ values at high temperature and low field, and the good intrinsic pinning of Y-123 thin film in order to maintain high $J_c$ values in high fields.

Another object of the present invention is to provide a new composite tape in which the primary function of a central Ag-sheathed (Bi,Pb)$_2$Sr$_2$Ca$_2$Cu$_3$O$_y$ (Bi-2223) filaments was to conduct transport current, with a YBa$_2$Cu$_3$O$_{7-\delta}$ (Y-123) thin films deposited on the Ag-sheathed Bi2223 tape to shield the applied magnetic field and protect the central Bi-2223 filaments.

Yet another object of the invention was to obtain critical current densities of the Y-123-coated, Ag sheathed Bi-2223 tapes which were better than those of an uncoated tape.

Still other aspects of the invention was that the Y-123 thin film exhibited a $T_c$≈72K and a broad transition region that shifted the effect to lower temperatures. Pole figure measurements showed widely spread a,b planes along the rolling direction, indicating high-angle grain boundaries that diminished the magnitude of the effect. Microstructural observations showed platelike grains of Y-123 with fine growth ledges in the thin film that was heat treated, in contrast with the microstructure of an as-coated thin film that showed large twinned grains. The experimental results showed that heat treating Y-123 thin film according to the previously known Bi-2223 tape schedule was compatible with an beneficial for Y-123.

BRIEF DESCRIPTION OF THE DRAWINGS

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

DETAILED DESCRIPTION OF THE INVENTION

Figure 1:
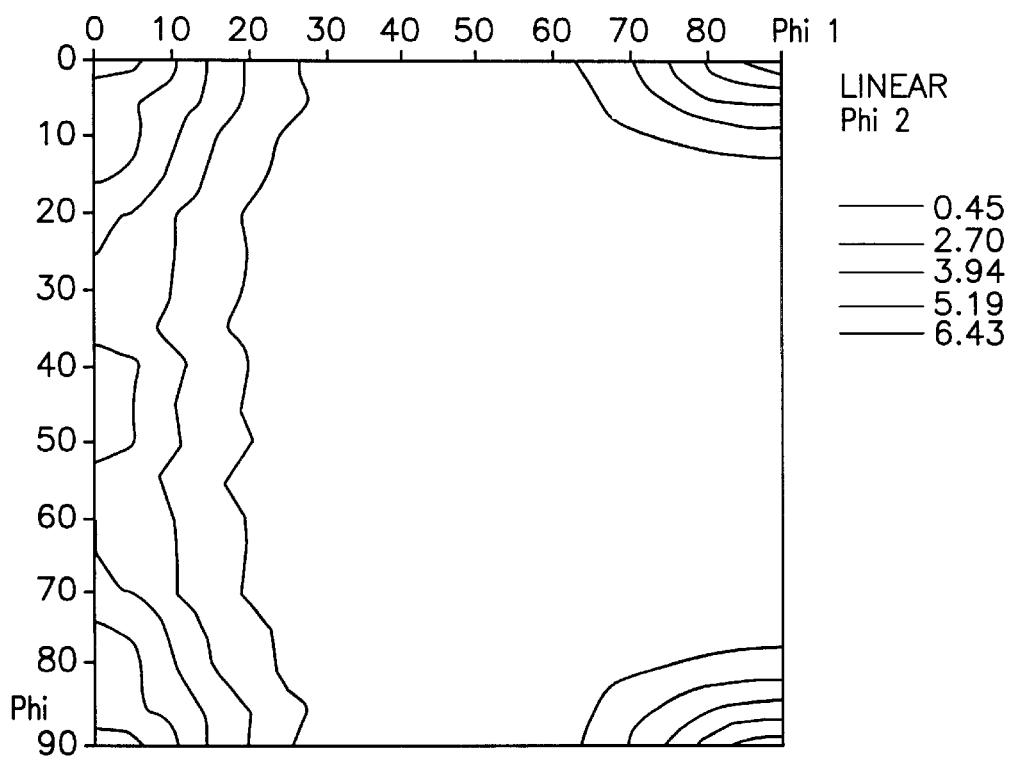
FIG. 1 is a graphical representation of the orientation distribution function (ODF) of Ag in as-rolled state in Ag-sheathed Bi-2223, showing cube-on-edge texture on corners and Goss texture in middle of Phi line for first quadrant at Phi2=0.

A Ag-sheathed multifilament Bi-2223 tape was made by the PIT technique with a Bi$_{1.8}$Pb$_{0.4}$Sr$_{2.0}$Ca$_{2.2}$Cu$_{3.0}$O$_y$ powder that was prepressed into billets before insertion into the silver tube for PIT processing. The tapes were subjected to relatively light deformation of 5% reduction per rolling pass in the final stages of tape processing. In the as-rolled state, tapes were ≈250 μm thick. Pole figure measurements were obtained on a Phillips X'pert X-ray diffractometer with parallel-beam optics and a graphite monochromator. Each sample was run under similar conditions. The pole figures for Ag in the as-deformed state from (111), (200), and (220) planes were obtained. The orientation distribution function (ODF) was obtained with Popla Texture software (Preferred Orientation Program, Los Alamos National Laboratory). This software combined the three pole figures from the tapes and from the random sample. The results were then converted back into Phillips Diffraction Texture software to present ODF graphically. FIG. 1, an ODF from the Ag in the as-rolled tape, shows the presence of cube-on-edge {100} <001> texture on the corners of the first quadrant. Goss texture {110} <001> is present, as can be seen for Phi between 40 and 50 along the edge of the first quadrant (along the Phil=0).

Figure 2:
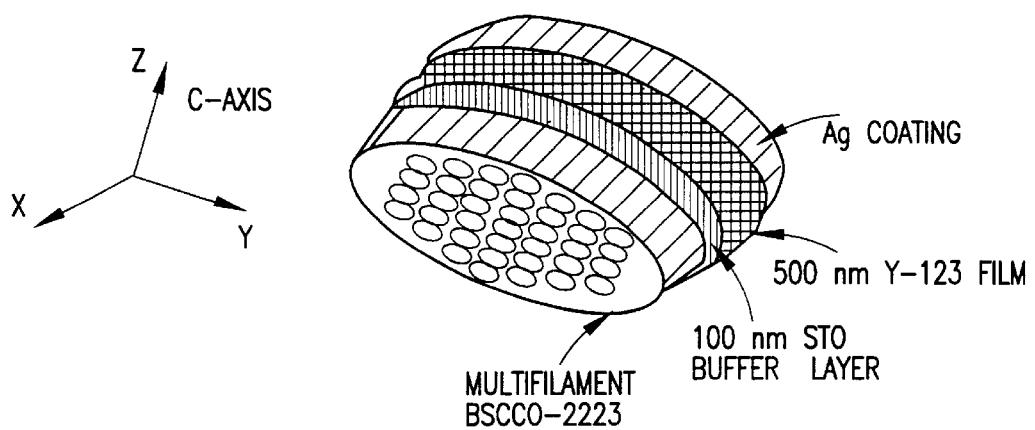
FIG. 2 is a schematic representation of Y-123 shielded Bi-2223 multifilament tape.

The as-rolled tape was cut into 4-cm lengths and Y-123 thin films were grown by off-axis magnetron sputter deposition. A 100-nm-thick layer of SrTiO$_3$ (STO) was deposited as a buffer. YBa$_2$Cu$_3$O$_{7-\delta}$ was sputtered in a 200-mtorr gas mixture of argon and oxygen. The substrates were at ≈700° C. FIG. 2 shows the arrangement of the shielded Bi-2223 tape. Coated and uncoated tapes were heat treated according to the Bi-2223 schedule. The heat treatments were carried out in an atmosphere of 7% O$_2$/93% Ar according to the following schedule:

a) Heat to 825° C. at a rate of 2° C./min.

b) Hold at 825° C. for 50 h.

c) Cool at 1° C./h to 800° C. and 10° C./h to 500° C.

d) Hold at 500° C. for 10 h in 100% O$_2$ atmosphere.

e) Cool at 60° C./h to room temperature in open air.

The transport critical current (I$_c$) (77 K, self field, 1 microvolt/cm criterion) was measured by a conventional four-probe method. The cross-sectional area of the sample was observed by scanning electron microscopy (SEM); compositional analysis was accomplished by energy-dispersive spectroscopy (EDS). Magnetic susceptibility was measured with a superconducting quantum interference device (SQUID). Magnetic hysteresis measurements at 20, 40, and 60 K were performed to determine J$_c$ as a function of temperature and applied field. The J$_c$ was determined from the expression $$J_c = 20 \frac{\Delta M}{w(1 - w/3l)}$$

where ΔM is the magnetization loop width in emu/cm$^3$, l is the length, and w, the width of the tape in centimeters.

An optimal texture in the metal substrate should help align the grains in the superconductor and thus improve its transport properties. Silver as a substrate material exhibits good electrical conductivity, good oxidation resistance, and rapid oxygen diffusivity. However, the ability of Ag to form a well-developed deformation texture is hampered by its low stacking-fault energy. Nickel, on the other hand, is expected to develop a strong deformation texture but its oxidation resistance is not as good as that of Ag. New Ag alloys were investigated to improve their texture and, therefore, grain alignment in superconductors. New Ag alloys are:

1. Ag-0.25 wt % Mg-0.25 wt. % Ni alloy having the trade name Consil 995.

2. Ag-Mg (various amounts of Mg, up to 1 wt %) alloy.

FIG. 1 shows an ODF of Ag in an as-rolled tape and the presence of cube-on-edge {100} <001> texture on the corners of the first quadrant. Goss texture {110} <001> is also present, as can be seen for Phi between 40 and 50 along the edge of the first quadrant (Phil=0). Y-123 thin film grown on Ag single crystals showed in-plane epitaxial alignment for films grown on Ag (110) surfaces. Ag was also used as a buffer layer. Y-123 thin films have previously grown on Ag-coated stainless steel substrates. The films exhibited T$_c$ above 90 K and a transition width of <2°.

Figure 3A:
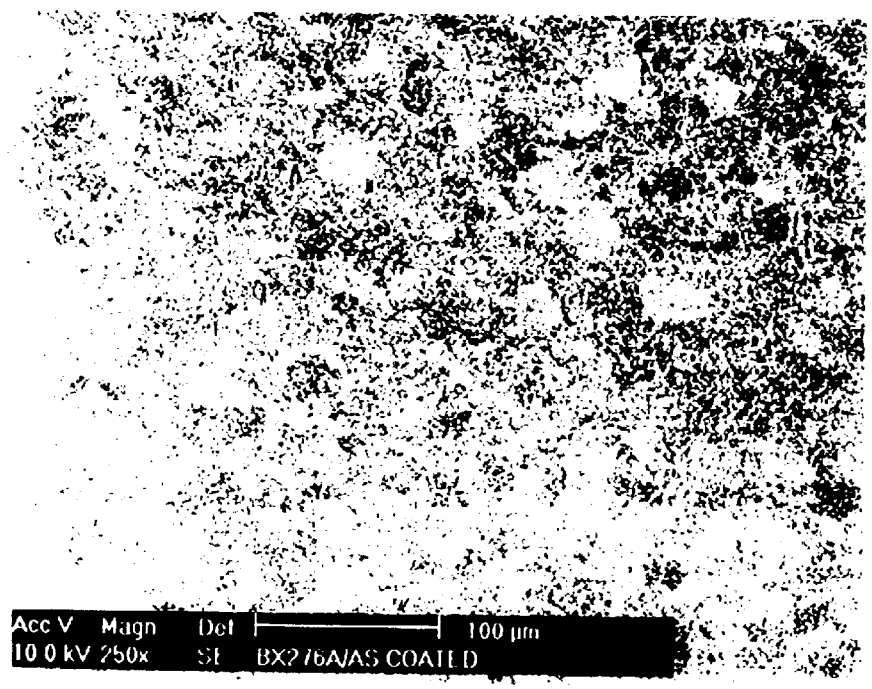
FIG. 3A is a SEM photomicrograph of the top surface of Y-123 thin film in an as-coated tape 250×drawing grain size of 10–20 microns.
Figure 3B:
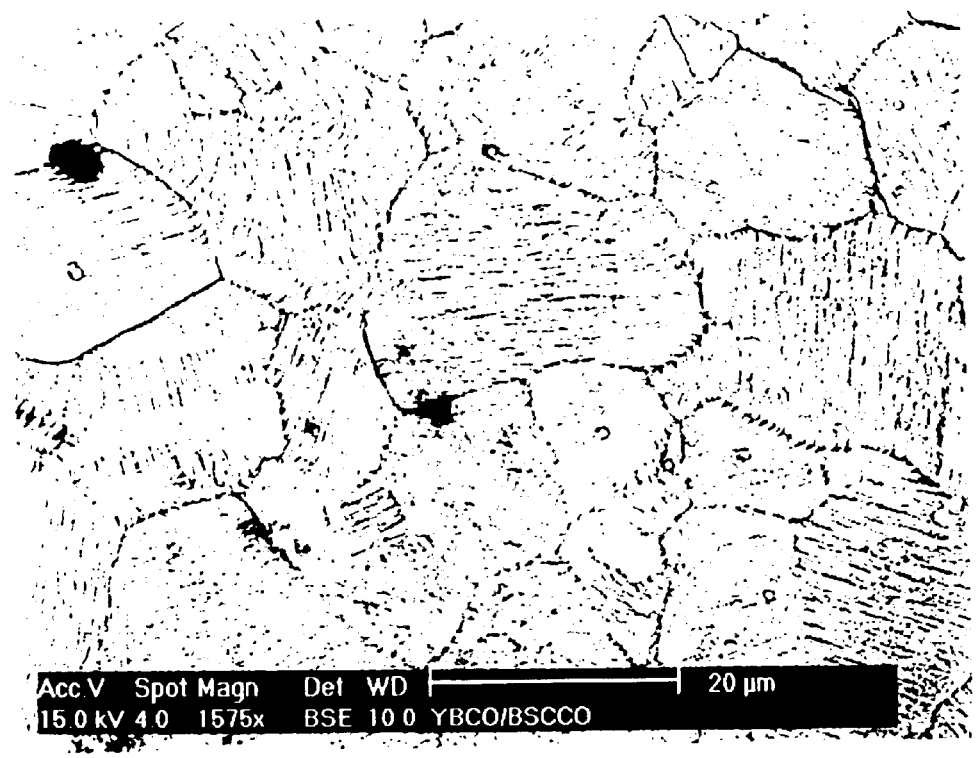
FIG. 3B are SEM photomicrographs of top surface of Y-123 thin film in as-coated tape 1575X, showing grain size of ≈10–20 $\mu$m.
Figure 3C:
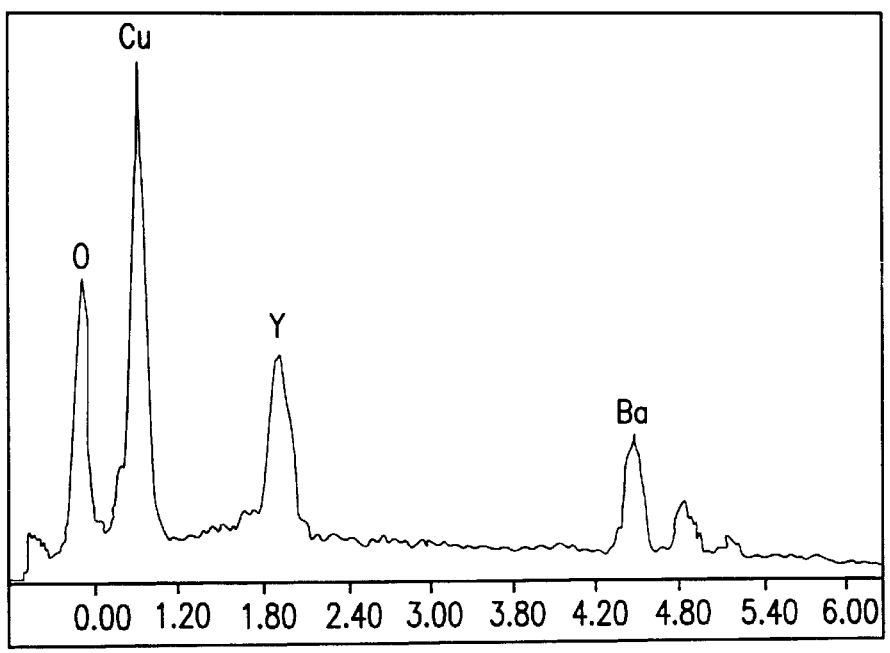
FIG. 3C shows an overall EDX scan with peaks for all three cations.

Y-123 thin film was also prepared on a {111}-oriented Ag film by off-axis rf magnetron sputtering. The film showed strong orientation not only for the c-axis but also for a b axes. T$_c$ was 84 K, with a transition region down to 77 K. FIGS. 3a and 3b show SEM photomicrographs of the top surface of Y-123 thin film in an as-coated tape. The overall microstructure consists of large 10–20 μm twinned grains. Energy dispersive X-ray (EDX) analysis of the overall microstructure at low magnification revealed peaks for all three cations.

Figure 4:
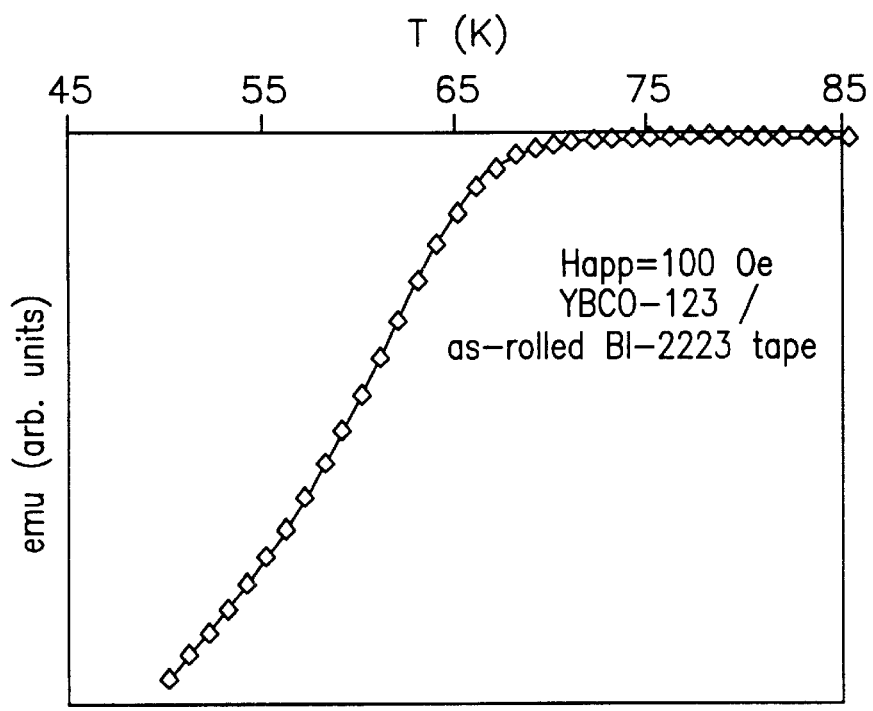
FIG. 4 is a graphical representation showing magnetic measurements of Y-123 thin film in as-coated tape, showing transition temperature $T_c$=72K and broad transition region for $H_{app}$=100 Oe.
Figure 5A:
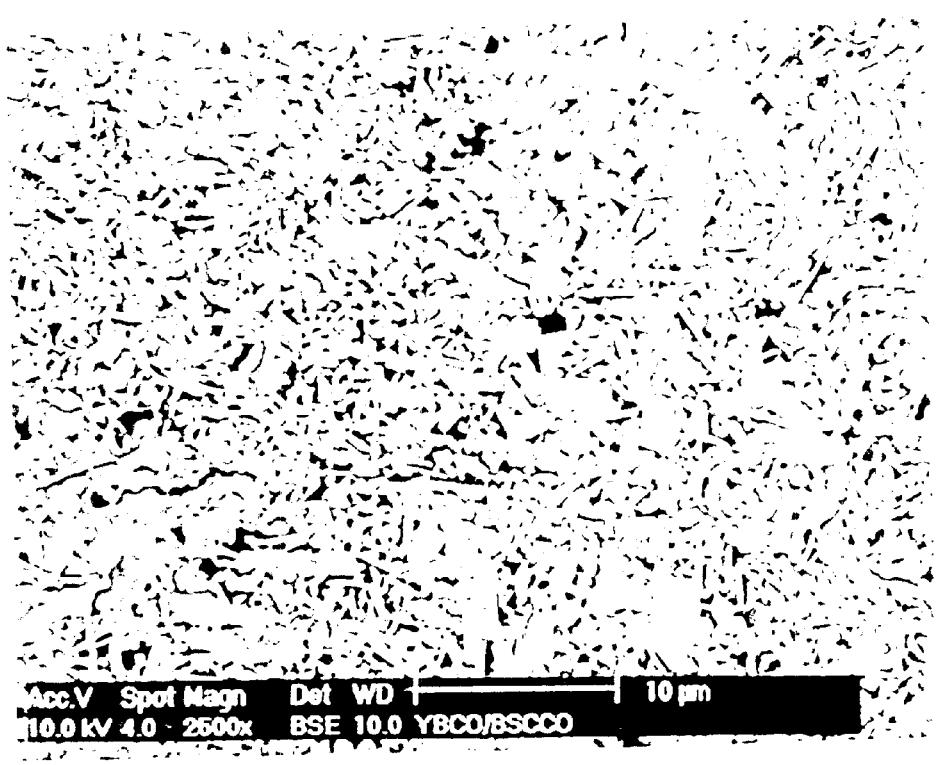
FIG. 5A is a SEM photomicrograph of the top surface of Y-123 thin film after heat treatment at 2625X, showing phase separation and much finer grain size.
Figure 5B:
FIG. 5B is a SEM photomicrograph of the top surface of Y-123 thin film after heat treatment at 21000X, showing phase separation and much finer grain size.
Figure 5C:
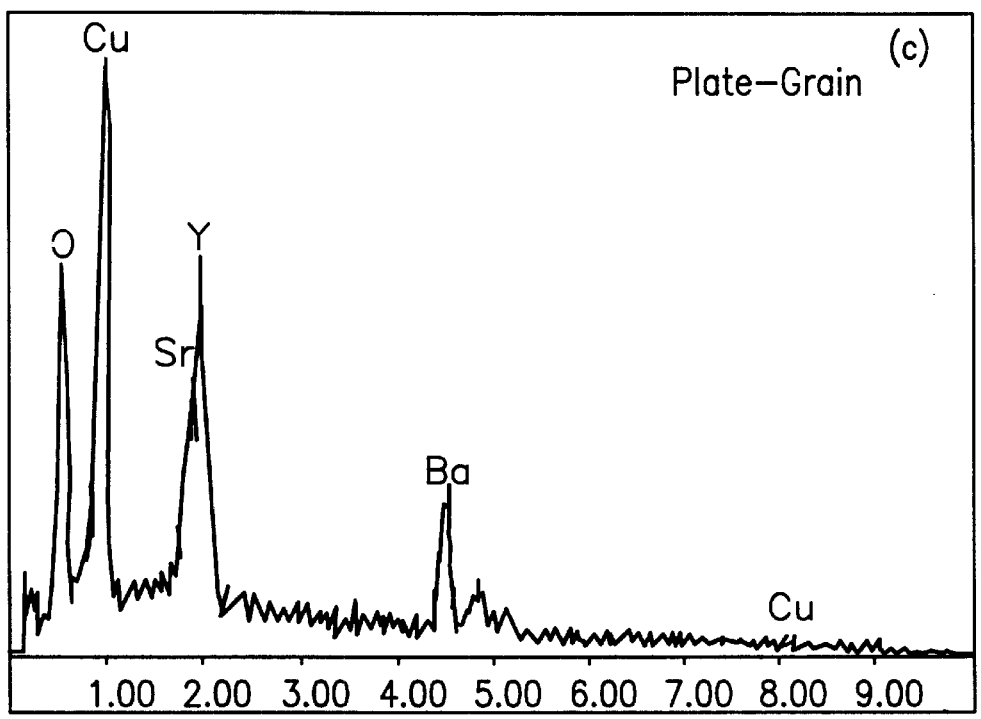
FIG. 5C is a SEM photomicrograph showing the EDX analysis from platelike grain showing peaks for Y, Ba and Cu.
Figure 5D:
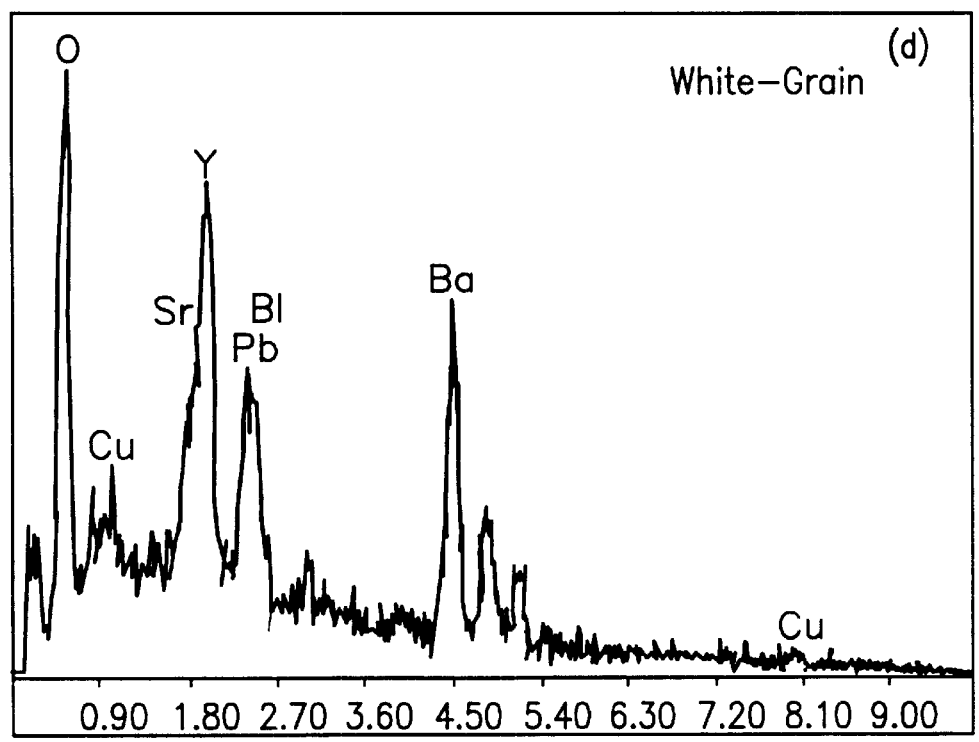
FIG. 5D is a SEM photomicrograph showing the EDX analysis from platelike grain showing peaks for Y, Ba and Cu wherein the analysis from white region shows absence of Cu peak.

FIG. 4 shows magnetic measurements as a function of temperature for Y-123 thin film in the as-coated tape at H$_{app}$≈100 Oe parallel to the c-axis. The transition temperature was T$_c$≈72 K along with the broad transition region. This T$_c$ was lower than some previously reported values, possibly due to the surface structure of the thin film grown on Ag-sheathed Bi-2223 tape. The texture of the Ag substrate should have an effect on the lattice of Y-123. The reason for growing STO as a buffer layer was to lower the lattice mismatch between Y-123 and Ag. Also, it is possible that the oxygen deficiency in the as-coated state caused lowering of the T$_c$.

The as-coated tape was heat treated at 825° C. in a 7% oxygen/93% argon atmosphere to produce the in-tape phase formation from 2212 to 2223. SEM analysis of the top surface of Y-123 thin film in the heat treated tape shown in FIG. 5, indicates phase separation in the Y-123 film during heat treatment and a grain morphology that is different from that of the film before heat treatment. New platelike grains appeared with very fine intergrowth ledges. This morphology is beneficial for flux pinning because of the nanometer-sized surfaces that formed during the growth. EDX analysis of the platelike grain shows peaks for Y, Ba and Cu, and the overall stoichiometry is similar to that of the as-coated state.

Figure 6:
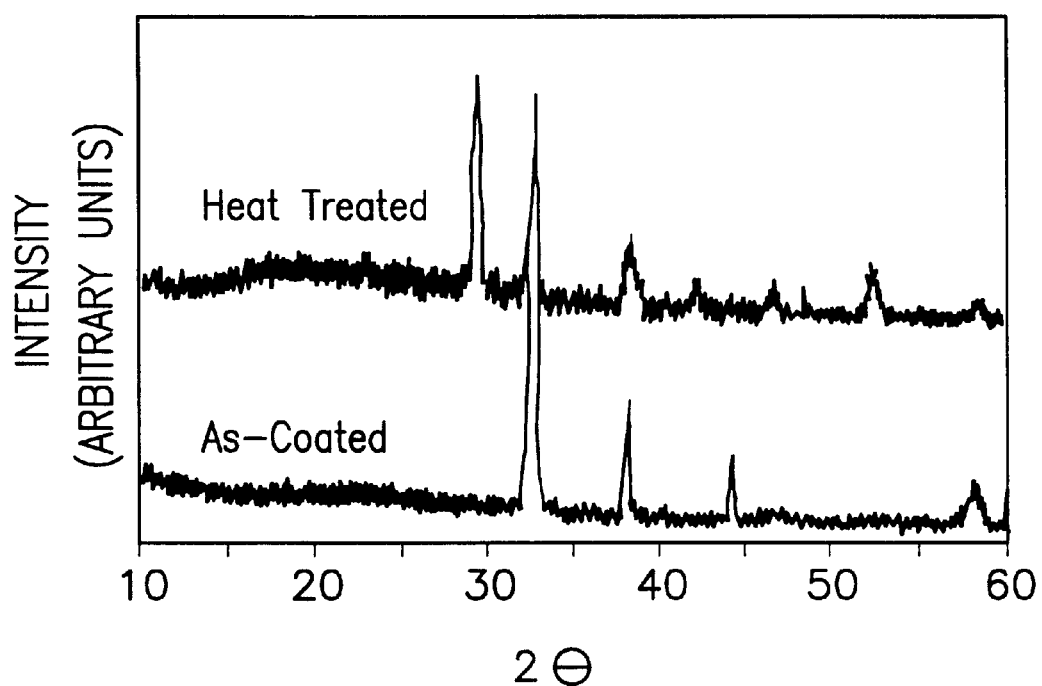
FIG. 6 is a graphical representation of XRD scans taken from top surfaces of as-coated and heat-treated tapes, showing presence of another peak in heat-treated tape, characteristic of BaY$_2$O$_4$ phase.

However, EDX analysis from the white grain next to the platelike grain in the back scattered image, shows absence of a Cu peak and the presence of peaks for Pb and Bi. Further investigation will be necessary to clarify the presence of these peaks in the Y-123 film. It appears that Pb and Bi diffused through the Ag sheath and into the film. Heat treatment not only caused change in grain size and morphology, but possibly in the nature of the grain boundaries. Generally, the improvement in $J_c$ for Y-123 thin film is attributed to increased conductivity of grain boundaries. Transmission electron microscopy has showed previously that Ag intercalation into the grain boundaries improved its transport properties. FIG. 6 shows X-ray diffraction (XRD) scans taken from the top surfaces of as-coated and heat-treated tapes. In the as-coated state, only peaks for Y-123 and Ag are present. However, the presence of another peak in the heat-treated tape is characteristic of $BaY_2O_4$ phase. These results confirm EDX analysis shown in FIG. 5.

Figure 7A:
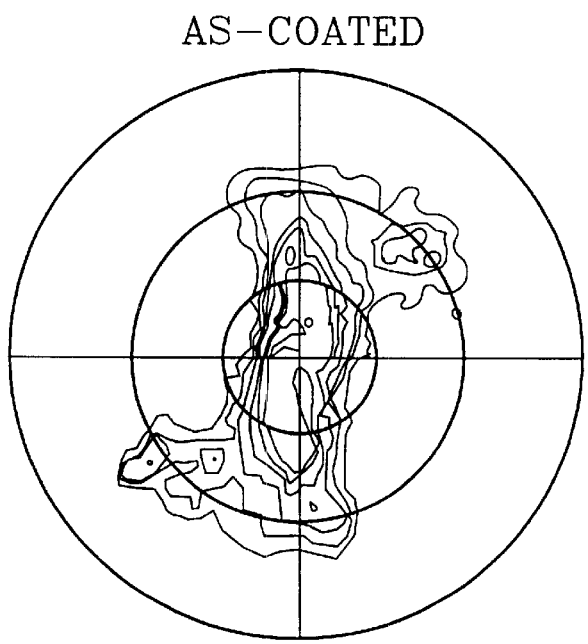
FIG. 7A is a graphical representation of pole figures of Y-123 thin films in as-coated tapes indicating that films grown on Ag-sheathed Bi-2223 tapes are not well treated.
Figure 7B:
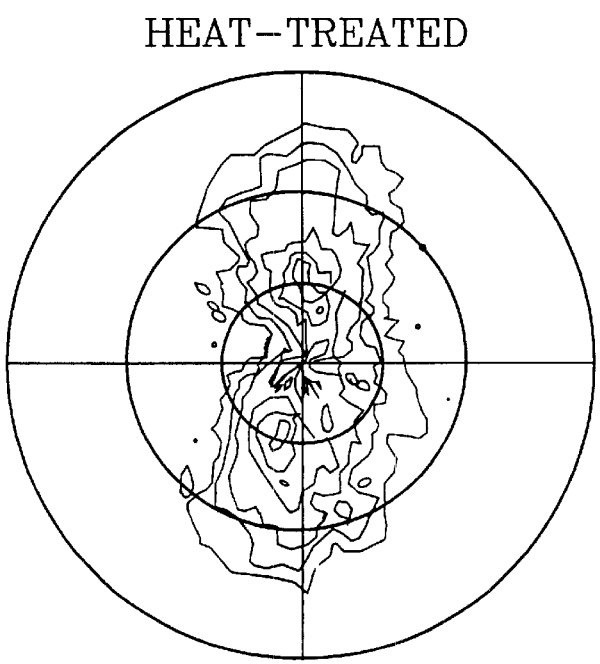
FIG. 7B is a graphical representation of pole figures of Y-123 thin films in heat-treated tapes indicating that films grown on Ag-sheathed Bi-2223 tapes are not well treated.

FIGS. 7a and 7b are (103) XRD pole figures of Y-123 thin film in the as-coated and heat-treated tapes. They indicate that films grown on Ag-sheathed Bi-2223 tapes were not well textured. The main reason for this is probably the mixed textured of Ag in the as-deformed state, as shown in FIG. 1. It is well known that biaxially textured substrates lead to higher quality Y-123 thin films.

Figure 8:
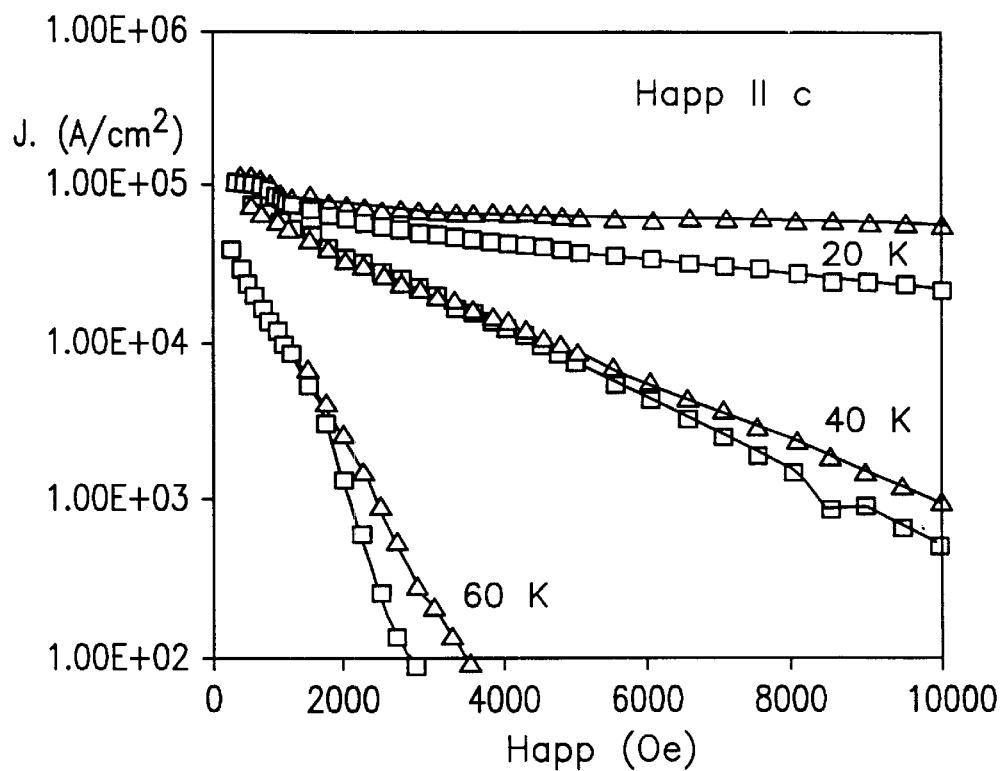
FIG. 8 is a graphical representation of the J$_c$ at 20, 40, and 60 K as a function of magnetic field applied parallel to c-axis: solid triangles represent Bi-2223 tape coated with Y-123 thin films and heat treated; open squares represent uncoated, and heat-treated reference tape.

FIG. 8 shows the dependence of the $J_c$ of a heat-treated Bi-2223 tape coated with Y-123 thin film on $H_{app}$ and T, the reference tape in the figure was uncoated but heat treated under the same conditions. A magnetic field was applied parallel to the c-axis for all measurements performed at 20, 30, and 60 K. $J_c$ was determined from the width of the hysteresis loop. The increase in $J_c$ is attributed to the magnetic contribution of the Y-123 thin film to the Bi-2223 grains. Its platelike morphology should enhance surface pinning. The increase is more pronounced at lower temperatures and at higher fields, a finding that is similar to the effect of the enhanced pinning by columnar defects in the Bi-2212 system. In the present invention, the effect is shifted to lower temperatures because of the critical temperature of Y-123 thin film. Also, the magnitude of the effect is affected by the misorientation of the Y-123 grains. However, our invention shows that this approach can be used to enhance $J_c$ response of Bi-2223 phase at higher temperatures and in higher magnetic fields. Moreover, from the processing point of view, the result show that heat treating Y-123 thin film according to the Bi-2223 tape schedule is compatible with and beneficial for Y-123. We believe that the effect is going to be more pronounced when substrates with a better texture, such as Ag-alloys are used.

Although the Bi-2223 superconductor tapes here disclosed were coated with Y-123 thin films, other RE superconductors are useful for the present invention. Particularly, 123 superconductors of Sm, Nd and various combinations of Sm, Nd and Y-123 superconductors are acceptable. Tl and Hg based superconductors can be used to shield Bi-2223 material. Buffer or intermediates such as $SrTiO_3$ or ceramics of Ce or Zr oxides can be used if needed to facilitate the adherence of the shielding super-conductor to the Bi-2223 material. Preferably, the buffer ceramic is an oxide having a thickness in the range of from about 0.1 to about 0.5 microns thick. The shielding superconductor may have a thickness in the range of from about 0.1 to about 0.5 microns. The Ag or Ag alloy coating for the Bi-2223 material may be various Ag-Ni alloys or others such as Ag-Mg, Ag-Ni-Mg alloys.

It is seen that the good alignment of $Bi_{1.8}Pb_{0.4}Sr_{2.0}Ca_{2.2}Cu_{3.0}O_y$ (Bi-2223) grains in Ag-sheathed superconducting tapes was used to obtain high $J_c$ values at high temperature and low field, and good instrinsic pinning of $YBa_2Cu_3O_{7-d}$ (Y-123) thin film to maintain $J_c$ values in high fields. A new composite multifilament tape was fabricated such that the central part contained Bi-2223 filaments, with the primary function of conducting the transport current. The central Bi-2223 filaments were surrounded by Y-123 thin film to shield the applied magnetic field and protect the Bi-2223 filaments. The $J_c$ values of the composite tape were better than those of an uncoated tape.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A Bi-2223 multifilament superconductor shielded from exterior magnetic fields by a RE-123 superconducting material.

2. The superconductor of claim 1, wherein Bi-2223 multifilaments are covered by Ag or Ag alloy.

3. The superconductor of claim 2, wherein the RE-123 superconducting material surrounds the Bi-2223 material and is covered by the Ag or Ag alloy.

4. The superconductor of claim 2, wherein there is a ceramic layer intermediate the Ag or Ag alloy and the RE-123 superconducting material shielding.

5. The superconductor of claim 4, wherein the ceramic layer intermediate the Ag or Ag alloy and the RE-123 superconducting material includes an oxide of Sr, Ce or Zr or mixtures including the oxides of Sr, Ce or Zr.

6. The superconductor of claim 5, wherein the ceramic layer is not less than about 0.1 micron in thickness.

7. The superconductor of claim 6, wherein the RE-123 is Y or Sm or Nd or mixtures thereof.

8. The superconductor of claim 7, wherein the RE-123 material is Y-123 and the ceramic is $SrTiO_3$.

* * * * *